United States Patent [19]

Chiu

[11] Patent Number: 5,542,174
[45] Date of Patent: Aug. 6, 1996

[54] METHOD AND APPARATUS FOR FORMING SOLDER BALLS AND SOLDER COLUMNS

[75] Inventor: George W. Chiu, Palo Alto, Calif.

[73] Assignee: Intel Corporation, Santa Clara, Calif.

[21] Appl. No.: 307,893

[22] Filed: Sep. 15, 1994

[51] Int. Cl.$^6$ ...................................................... H05K 3/34
[52] U.S. Cl. ..................... 29/840; 174/52.4; 228/180.21; 228/180.22; 361/779; 437/209
[58] Field of Search ........................ 29/840; 228/180.21, 228/180.22; 874/52.4; 361/779; 437/209

[56] References Cited

U.S. PATENT DOCUMENTS

| | | |
|---|---|---|
| 3,292,240 | 12/1966 | McNutt et al. . |
| 3,303,393 | 2/1967 | Hymes et al. . |
| 3,436,818 | 4/1969 | Merrin et al. . |
| 3,486,223 | 12/1969 | Butera . |
| 3,811,186 | 5/1974 | Larnerd et al. . |
| 3,921,285 | 11/1975 | Krall . |
| 4,545,610 | 10/1985 | LaKritz et al. ................ 228/180.22 X |
| 4,673,772 | 6/1987 | Satoh et al. ............................ 29/840 X |
| 4,693,770 | 9/1987 | Hatada .................................... 29/840 X |
| 4,752,027 | 6/1988 | Gschwend ............................ 228/180.2 |
| 4,818,728 | 4/1989 | Rai et al. ........................ 228/180.21 X |
| 5,075,965 | 12/1991 | Carey et al. ............................... 29/840 |
| 5,186,383 | 2/1993 | Melton et al. ........................ 29/840 X |
| 5,269,453 | 12/1993 | Melton et al. ..................... 228/180.22 |

FOREIGN PATENT DOCUMENTS

89/02653  3/1989  WIPO ............................... 228/180.22

OTHER PUBLICATIONS

IBM Tech Disclosure Bulletin vol. 16 No. 3 Aug. 1973 p. 767 by Coombs.

T. Caulfield, J. A. Benanati, J. A. Acocella & M. S. Cole, "Cermaic Ball Grid Arrays" and Ceramic Column Grid Arrays, Semicon conference, San Francisco, Jun. 1993, 28 pages.

*Primary Examiner*—Carl J. Arbes
*Attorney, Agent, or Firm*—Blakely, Sokoloff, Taylor & Zafman

[57] ABSTRACT

A method for forming solder balls and an apparatus and method for forming solder columns on the electrical contact pads of an electronic package in order to establish a more reliable electrical and mechanical connection between an electronic package and a printed circuit board. In one embodiment, solder balls are formed on the electrical contact pads of a package by placing solder cylinders over the electrical contact pads and then passing the package through a reflow furnace where the solder cylinders take the form of spheres and are wetted onto the pads. In a second embodiment, a laminated solder column is formed that is resistant to collapse during the manufacturing process. The laminated solder column comprises a solder cylinder being clad on its top and bottom surfaces with a solder material having a lower melting temperature than that of the center solder cylinder. When attaching the solder column to a package or a printed circuit board reflow temperatures are maintained above the melting temperature of the cladding material but below the melting temperature of the center solder cylinder such that the cladding is wetted onto the electrical contact pads of the package or printed circuit board while the center solder cylinder maintains its solid form.

37 Claims, 2 Drawing Sheets

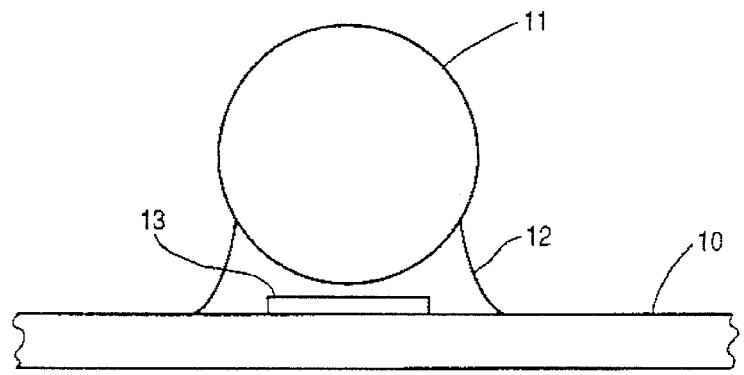
FIG_1 (PRIOR ART)
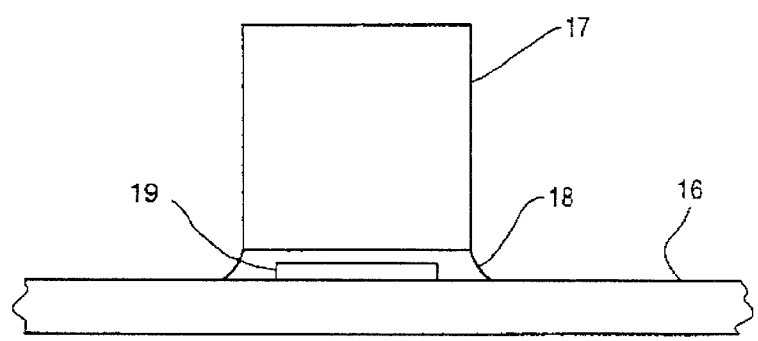
FIG_2
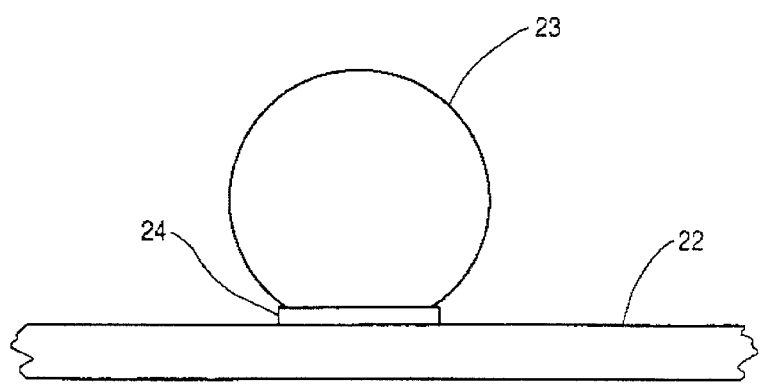
FIG_3

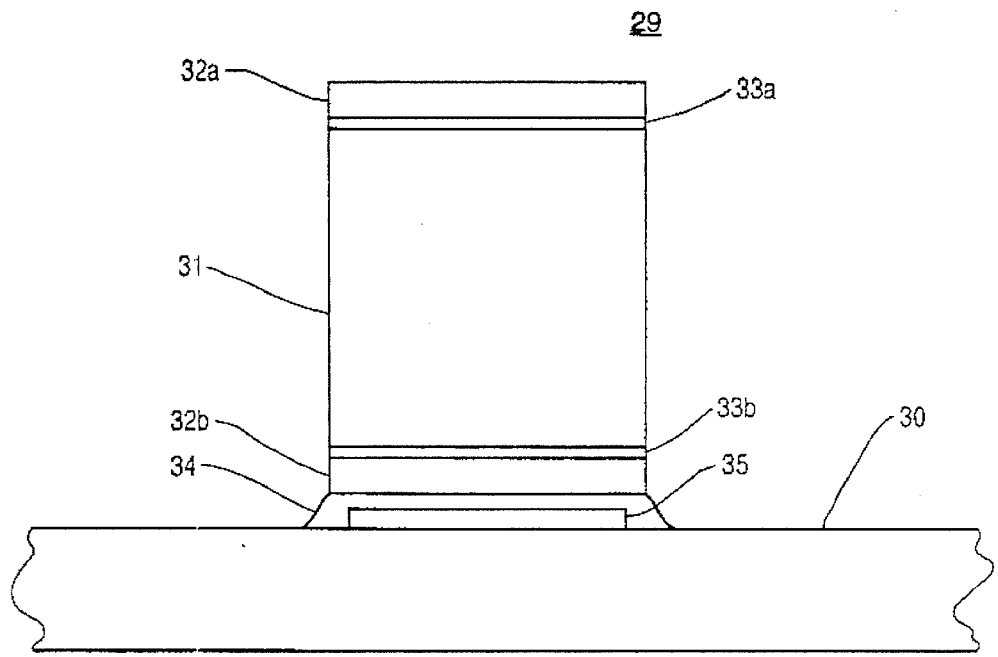
FIG_4A
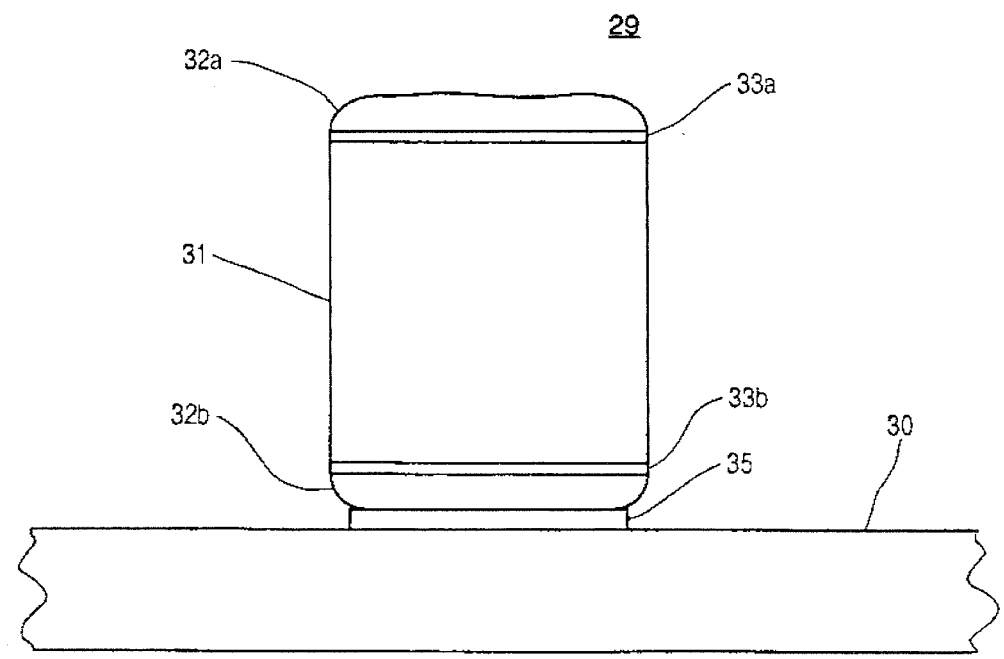
FIG_4B

METHOD AND APPARATUS FOR FORMING SOLDER BALLS AND SOLDER COLUMNS

FIELD OF THE INVENTION

The present invention relates to the field of semiconductor packaging. More specifically, the invention relates to an apparatus and method for establishing a more reliable electrical and mechanical connection between a package and a printed circuit board.

BACKGROUND OF THE INVENTION

Integrated circuits are typically housed within a package that is mounted to a printed circuit board (PCB). The package is designed to protect the integrated circuit device from damage, to provide adequate heat dissipation during operation, and to provide electrical connection between the integrated circuit device and a PCB (e.g., a peripheral card, a motherboard and the like). These conventional packages may include a variety of packages such as pin grid array (PGA), land grid army (LGA), ball grid array (BGA), column grid array (CGA), and other packages. The present invention is directed at improving the reliability of the electrical/mechanical connection formed between a package and a PCB.

A BGA package is an integrated circuit package which has a plurality of solder balls that interconnect the package to a PCB. A BGA package typically consist of a substrate having an array of electrical contact pads disposed about the substrate's bottom surface. Using existing techniques, spherical shaped solder balls are attached to the package by first applying a resin flux to the electrical contact pads, positioning the solder balls onto the electrical contact pads, and running the package through a reflow furnace. FIG. 1 illustrates the solder ball, flux and electrical contact pad configuration before the reflow process. During the reflow process the solder balls are held in position by the flux and wetted onto the electrical contact pads. In addition to holding the solder balls in position, the flux promotes the wetting of the solder balls to the contact pads and chemically cleans the contact pad surfaces. As shown in FIG. 3, after having passed through the reflow furnace, the solder balls have a truncated portion located near the solder ball and electrical contact pad interface, but in all other respects maintain their spherical shape. In lieu of using resin flux, other methods utilize supporting fixtures to hold the solder balls in position during reflow with or without the use of flux.

One problem associated with using solder balls is that, because of their spherical shape, they tend to roll out of position during the reflow process. As a result, the current methods require either that a fixture be used or that additional resin flux be applied to the contact pads to ensure that the solder balls remain in position during reflow. There are, however, a number of problem associated with the current methods of forming solder balls on the contact pads of BGA packages. To begin with, the use of additional flux to hold the solder balls in position is undesirable since it results in the need to remove the surplus flux after reflow. The use of a fixture to hold the solder balls in position is also undesirable in that it involves an additional manufacturing step and requires additional manufacturing hardware to bond the solder ball to the package during reflow. In addition, the solder balls themselves are costly items due to the elaborate method of manufacture required to ensure solder ball diameter uniformity.

As previously discussed, other methods are also used to form the electrical and mechanical connection between a package and a printed circuit board. One such method includes the use of column grid arrays. Column grid arrays are used in applications where the alignment between the electrical contact pads of a package and a PCB significantly vary during the manufacturing process causing high shear stresses to occur at the electrical contact pad and solder interfaces. In particular, column grid arrays are most often used in applications when large packages are involved and where the coefficient of thermal expansion of a package greatly differs from the coefficient of thermal expansion of the PCB.

Column grid arrays include a plurality of solid solder columns that are positioned between the electrical contact pads of a package and a PCB. The connection between the electrical contact pads on a package and PCB are generally formed by first applying a resin flux to the electrical contact pads, positioning the solder columns between the pads, and running the unit through a reflow furnace. The solder column height, which is greater than the diameter of a typical solder ball, allows for greater flexibility in establishing the connection between a package and a PCB. By allowing for greater flexibility, the solder columns reduce stresses at the solder column/electrical contact pad interfaces which, in turn, results in higher product reliability.

One problem associated with using solder columns lies in their susceptibility to collapse and form solder balls during reflow which often results in bad electrical and mechanical connections.

What is needed then is a method which solves the aforementioned problems associated with forming reliable connections between a package and a PCB. As will be seen, the present invention provides an improved apparatus and method for forming column grid arrays and an improved method for manufacturing packages having solder balls which solve the aforementioned problems.

SUMMARY OF THE INVENTION

An Improved apparatus and method for forming column grid arrays and an improved method for manufacturing packages using solder balls, such as BGA's, is disclosed.

The improved method for manufacturing a package having solder balls is accomplished primarily through three steps. Solder cylinders are attached to a package by applying a resin flux to the package's electrical contact pads, positioning the solder cylinders onto the electrical contact pads, and running the package through a reflow furnace. The reflow temperature is adjusted above the melting temperature of the solder cylinders such that during reflow the solder cylinders take the form of spheres having a truncated portion located near the solder and electrical contact pad interface. Thus, the present invention provides a method for mounting and forming solder balls onto packages while eliminating the problems associated with using conventional solder balls during the manufacturing process.

The present invention also relates to an apparatus and method for forming column grid arrays that electrically and mechanically couple the electrical contact pads of a package to those on a PCB. In one embodiment the apparatus includes a package having a set of electrical contact pads disposed about one of its outside surfaces with solder columns attached to, and extending out from, the electrical contact pads. Each solder column comprises a solder cylinder being clad on its top and bottom surfaces with a material having a lower melting temperature than that of the center solder cylinder. The solder columns are attached to the electrical contact pads by applying a resin flux to the pads, positioning the laminated solder columns onto the electrical contact pads, and running the unit through a reflow furnace. The reflow temperature is selected such that during reflow the solder cladding melts and is wetted onto the electrical contact pads of the package while the center solder cylinder maintains its solid form. The package can be attached to a PCB at some later time using a similar process.

BRIEF DESCRIPTION OF THE DRAWINGS

The present invention is illustrated by way of example and is not limited by the figures of the accompanying drawings, in which like references indicate similar elements, and in which:

FIG. 1 illustrates the solder ball, flux, and electrical contact pad configuration of a conventional prior art BGA package before reflow.

FIG. 2 illustrates the solder cylinder, flux, and electrical contact pad configuration of one embodiment of the present invention before reflow.

FIG. 3 illustrates the solder and electrical contact pad configuration of the packages illustrated in FIGS. 1 and 2 after reflow.

FIG. 4A illustrates the laminated solder column, flux, and electrical contact pad configuration of another embodiment of the present invention before reflow.

FIG. 4B illustrates the laminated solder column and electrical contact pad configuration of the present invention illustrated in FIG. 4A after reflow.

DETAILED DESCRIPTION

An apparatus and method for forming column grid arrays and a method for manufacturing packages having solder balls is described. In the following description, numerous specific details are set forth such as material types, dimensions, processing steps, etc., in order to provide a thorough understanding of the present invention. However, it will be obvious to one of skill in the art that the invention may be practiced without these specific details. In other instances, well known elements and processing techniques have not been shown in particular detail in order to avoid unnecessarily obscuring the present invention.

FIG. 1 illustrates a conventional prior art BGA package before reflow. The package typically consist of a substrate 10 which has electrical contact pads 13 disposed about one of its surfaces. Solder ball 11 is attached to electrical contact pad 13 by first applying a resin flux 12 to pad 13, positioning solder ball 11 over pad 13, and running the unit through a reflow furnace. As mentioned earlier, practitioners have used either a flux or supporting device to hold the solder ball in position during reflow. In FIG. 1, solder ball 11 is shown being supported by flux 12. FIG. 3 illustrates the solder 23 and electrical contact pad 24 configuration after reflow.

There are a number of problems associated with the current methods of forming solder balls on the contact pads of BGA packages. Because solder balls have a spherical shape, either additional flux or a supporting fixture is required to hold the solder balls in place during the manufacturing process. The use of additional flux to hold the solder ball in position results in the need to remove the surplus flux after reflow which increases manufacturing costs. Using a fixture to hold the solder ball in position is also costly in that it involves an additional manufacturing step and requires additional manufacturing hardware to bond the solder ball to the package. In addition, the solder balls themselves are expensive due to their elaborate method of manufacture. To reduce manufacturing costs and to increase package reliability, the present invention forms spherical solder members on the electrical contact pads of a package by first positioning solder cylinders over the electrical contact pads and then passing the unit through a reflow furnace where the solder cylinders acquire a spherical shape while being wetted onto the electrical contact pads.

FIG. 2 shows a cross sectional view of one embodiment of the present invention before reflow. Substrate 16 represents one wall of a package. The substrate contains electrical interconnects (not shown) that electrically couple a semiconductor device housed within the package (not shown) to electrical contact pads located on the outside surface of the substrate. Substrate 16 is made of any temperature resistant material, such as alumina oxide, high temperature PCB, etc., in order to prevent the substrate from melting under normal reflow conditions. Electrical contact pad 19 represents a typical electrical contact pad which comprises an electrically conductive material, such as, for example, gold plated nickel.

The connection between substrate 16 and a PCB (not shown) is accomplished through a solder medium which electrically and mechanically connects the electrical contact pads of substrate 16 to a corresponding set of pads on the PCB (not shown). In lieu of using the solder balls of prior art methods, the present invention uses solder cylinders in the manufacture of packages. As shown in FIG. 2, the method of forming a package under the present invention includes applying a flux 18 over electrical contact pad 19 and positioning solder cylinder 17 over pad 19. When all of the solder cylinders of a particular package are in place, the package is then run through a reflow furnace. The reflow furnace temperature is adjusted above the melting temperature of solder cylinder 17 such that during reflow solder cylinder 17 takes on the form of a sphere and at the same time is wetted onto electrical contact pad 19. Prior to and during the reflow process solder cylinder 17 is held in position by flux 18. In addition to holding solder cylinder 17 in position, flux 18 also promotes the wetting of the solder to electrical contact pad 19 and chemically cleans the bonding surfaces of solder cylinder 17 and electrical contact pad 19. Because solder cylinder 17 has a larger contact surface than a conventional solder ball, less flux is required to hold the solder member in place during the manufacturing process. FIG. 3 illustrates the substrate, solder and electrical contact pad configuration of the present invention after reflow.

Solder cylinder 17 may comprise any solder material composition whose properties are conducive to the manufacturing process just described. It is further understood that a solder member of any geometric shape that has at least one substantially planar surface may be used in lieu of the solder cylinder just described, such as, for example, a rectangular solder member or a sphere with a pedestal or flat surface. In one embodiment of the present invention solder cylinder 17 comprises 60/40 Sn/Pb solder having a low melting temperature of approximately 183 degrees Celsius. In this embodiment the reflow furnace temperature is set at approximately 225 degrees Celsius, plus or minus 20 degrees. The diameter and height of solder cylinder 17 will vary depending upon the desired solder ball diameter. As an example, when a solder ball diameter of 0.025 inches is desired, solder cylinder 17 has a diameter of 0.020 inches and a height of 0.020 inches. Flux 18 typically comprises a resin flux. It should be understood, however, that any flux that promotes wetting and is capable of holding solder cylinder 17 in position during the manufacturing process may be used.

With reference to FIG. 4B, a cross-sectional view of another embodiment of the present invention is shown wherein laminated solder cylinders are used to form solder columns that electrically and mechanically couple the electrical contact pads of a package to those on a PCB. As previously discussed, column grid arrays are used in applications where the alignment between the electrical contact pads of a package and a PCB significantly vary during the manufacturing process causing high shear stresses to occur at the solder and electrical contact pad interface. One problem associated with using solder columns lies in their susceptibility to collapse during the manufacturing process which can result in bad electrical and mechanical connections. To eliminate the problems associated with collapsing solder columns, the present invention uses a laminated solder column that will not collapse during the manufacturing process.

With continuing reference to FIG. 4B, solder column 29 is shown coupled to substrate 30. Substrate 30 represents one wall of a package and contains electrical interconnects (not shown) that electrically couple a semiconductor device housed within the package (not shown) to electrical contact pads located on the outside surface of the substrate. Substrate 30 is made of any temperature resistant material, such as alumina oxide, in order to prevent the substrate from melting under normal reflow conditions. Electrical contact pad 35 represents a typical electrical contact pad which may comprise many of a number of electrically conductive materials that are commonly used in the art, such as, for example, gold plated nickel metalization.

The connection between substrate 30 and a PCB (not shown) is made through laminated solder column 29 which electrically and mechanically couples the electrical contact pads of substrate 30 to a corresponding set of pads on a PCB (not shown). FIG. 4B illustrates a typical solder column 29 being attached to electrical contact pad 35 of substrate 30. Solder column 29 comprises a solder cylinder 31 having cladding 32a and 32b attached to its top and bottom surface, respectively. In a currently preferred embodiment, cladding 32a and 32b are physically separated from solder cylinder 31 by barrier layers 33a and 33b. In instances where solder column 29 is attached only to a package, column 29 may comprise a solder cylinder 31 having only cladding and barrier layers 32b and 33b, respectively.

Solder cylinder 31 typically comprises a 90/10 Pb/Sn solder having a melting temperature of approximately 300 Celsius, plus or minus 12 degrees. Cladding 32a and 32b comprise a material having a lower melting temperature then that of solder cylinder 31. For instance, in an embodiment where solder cylinder 31 comprises 90/10 Pb/Sn solder, cladding 32a and 32b may comprise 60/40 Sn/PB solder which has a melting temperature of approximately 183 degrees Celsius. However, when solder cylinder 31 comprises 90/10 Pb/Sn solder, cladding 32a and 32b may comprise any of a number of other solder compositions which have a melting temperature below approximately 288 degrees Celsius. Barrier layers 33a and 33b form a boundary between solder cylinder 17 and cladding 32a and 32b, respectively. Layers 33a and 33b act to prevent the diffusion of solder cylinder 17 into cladding 32a and 32b thereby maintaining the cladding at a low eutectic flow temperature. In an embodiment having a solder cylinder comprising 90/10 Pb/Sn and cladding comprising 60/40 Sn/Pb, barrier layers 33a and 33b may comprise nickel or palladium. It should be understood, however, that barrier layers 33a and 33b may comprise any material that is electrically conductive and capable of being bonded to solder cylinder 31 and cladding 32a and 32b while maintaining a physical barrier between the layers. It should be further understood that barrier layers 33a and 33b are essential only in those embodiments where the diffusion rate between solder cylinder 31 and cladding 32a and 32b is high enough to significantly alter the eutectic flow temperature of cladding 32a and 32b during the reflow process.

One advantage of the above-described embodiment lies in its use of a laminated solder column that is resistant to collapse during the manufacturing process when solder column 29 is coupled to electrical contact pad 35 under normal reflow conditions. Because cladding layers 32a and 32b have a lower melting temperature than solder cylinder 31, a reflow temperature may be selected that is greater than the melting temperature of cladding 32a and 32b, yet is lower than the melting temperature of solder cylinder 31. As a result, cladding 32a and 32b are wetted onto their respective electrical contact pads while solder cylinder 31 maintains its solid form during the reflow process.

The height of laminated solder column 29 and the thickness of each column layer is dependent upon a number of factors including the size of the CGA package and the difference in the coefficients of thermal expansion between the package and the PCB. As the size of a package increases the distance from the center of the substrate to an electrical contact pad that lies along the outer periphery of the substrate becomes greater. As the distance between the contact pads and the center of substrate 30 increases the differential expansion between the package and the PCB is amplified thereby requiring coupling devices between the electrical contact pads of the package and the PCB that have greater tolerances for flexing. Hence, as the size of a package increases, or as the difference in the coefficients of thermal expansion between a package and a PCB increases, the solder column height required to couple the package to the PCB also increases. By way of example, the height of solder column 29 is typically on the order of 0.035 to 0.040 inches. However, solder columns with heights outside this range may be required depending upon the particular components being coupled. In a solder column having a height of 0.040 inches, solder cylinder 31, cladding 32a and 32b, and barrier layers 33a and 33b have thicknesses of approximately 0.025, 0.007, and 0.0005 inches, respectively. In many embodiments the column height is constant within a given package in order to maintain planarity for PCB contact.

The following is a detailed description of the method for coupling a laminated solder column to a CGA package. As shown in FIG. 4A, the method includes applying resin flux 34 over electrical contact pad 35 and positioning laminated solder column 29 over electrical contact pad 35. When all of the solder columns of a particular package are in place, the package is then run through a reflow furnace. The reflow furnace temperature is selected such that during reflow cladding 32b melts and is wetted onto electrical contact pad 35 while solder cylinder 31 maintains its solid form. For example, when solder cylinder 31 comprises 90/10 Pb/Sn and cladding layers 32a and 32b comprise 60/40 Sn/Pb, a reflow temperature of approximately 225 degrees Celsius is selected. After reflow, the package is cooled and any remaining flux residue is cleaned from the surface of substrate 30. The CGA package can be coupled to a PCB at some later time using a similar process.

It is appreciated that the methods and apparatus of the present invention may be used in other technologies to form electrical and/or mechanical connections between other types of electronic devices. It is further understood that the relative dimensions, geometric shapes, materials and process parameters set forth within the specification are exemplary of the disclosed embodiments only. Other embodiments may utilize different dimensions, shapes, materials, and process settings, etc., to achieve substantially the same results.

What is claimed is:

1. A method of forming a solder ball on a package, said method comprising the steps of:
   a) positioning a solid solder member having at least one planar surface over an electrical contact pad having a second planar surface wherein said at least one planar surface is substantially parallel to said second planar surface;
   b) heating said solid solder member to a temperature that is above the melting temperature of said solid solder member such that said solid solder member becomes substantially spherical and is wetted onto said electrical contact pad.

2. The method according to claim 1 wherein said solid solder member comprises a solder cylinder.

3. The method according to claim 1 wherein said solid solder member comprises a rectangular solder member.

4. The method according to claim 1 wherein said solid solder member comprises 60/40 Sn/Pb.

5. The method according to claim 4 wherein said heating step is performed at a temperature in the range of approximately 225° C. plus or minus 20° C.

6. A method of forming a solder ball on a package, said method comprising the steps of:
   a) positioning a solid solder member having at least one planar surface over an electrical contact pad having a first planar surface such that said at least one planar surface is substantially parallel to said first planar surface, said electrical contact pad being located on a first surface of a substrate;
   b) placing said substrate into a reflow furnace having a temperature above the melting temperature of said solid solder member such that said solid solder member becomes substantially spherical and is wetted onto said electrical contact pad.

7. The method according to claim 6 wherein prior to positioning said solid solder member over said electrical contact pad a flux is applied over said first planar surface of said electrical contact pad.

8. The method according to claim 6 wherein prior to positioning said solid solder member over said electrical contact pad a flux is applied over said at least one planar surface of said solid solder member.

9. The method according to claim 6 wherein prior to positioning said solid solder member over said electrical contact pad a flux is applied over said at least one planar surface of said solid solder member and said first planar surface of said electrical contact pad.

10. The method according to claim 7, 8 or 9 wherein said flux comprises a resin flux.

11. The method according to claim 6 wherein said solid solder member comprises a solder cylinder.

12. The method according to claim 6 wherein said solid solder member comprises a rectangular solder body.

13. The method according to claim 6 wherein said solid solder member comprises 60/40 Sn/Pb.

14. The method according to claim 13 wherein said reflow furnace temperature is in the range of approximately 225° C. plus or minus 20° C.

15. A method of forming solder balls for attaching an electronic package to a motherboard, said method comprising the steps of:
   a) applying a flux over a plurality of electrical contact pads located on a first surface of a substrate;
   b) positioning a solid solder cylinder over each of said electrical contact pads such that said flux is disposed between said solid solder cylinders and said electrical contact pads;
   c) placing said substrate into a reflow furnace having a temperature above the melting temperature of said solid solder cylinders such that said solid solder cylinders become substantially spherical and are wetted onto said electrical contact pads.

16. The method according to claim 15 wherein said flux is applied to said solid solder cylinders.

17. The method according to claim 15 or 16 wherein said flux comprises a resin flux.

18. The method according to claim 15 wherein said solid solder cylinders comprise 60/40 Sn/Pb.

19. The method according to claim 18 wherein said reflow furnace temperature is in the range of approximately 225° C. plus or minus 20° C.

20. A method for attaching a laminated solder column to an electrical contact pad comprising the steps of:
   a) applying a flux over an electrical contact pad;
   b) positioning a laminated solder column having a first and second solder layer over said electrical contact pad such that said flux is disposed between said second solder layer and said electrical contact pad;
   c) placing said substrate into a reflow furnace having a temperature above the melting temperature of said second solder layer but below the melting temperature of said first solder layer such that said second solder layer is wetted onto said electrical contact pad.

21. The method according to claim 20 wherein said flux is applied to said second solder layer of said laminated solder column.

22. The method according to claim 20 wherein said first and second solder layers comprise solder cylinders.

23. The method according to claim 20 wherein said first and second solder layers comprise rectangular solder members.

24. The method according to claim 20 wherein said second solder layer comprises 60/40 Sn/Pb.

25. The method according to claim 20 wherein said first solder layer comprises 90/10 Pb/Sn.

26. A method of forming a solder column on an electronic device, said method comprising the steps of:
   a) applying a first barrier to a first planar surface of a first solder body;
   b) applying a second barrier to a second planar surface of said first solder body;
   c) cladding said first planar surface of said first solder body with a second solder body having a third and fourth planar surface such that said first barrier is disposed between said first and third planar surfaces;
   d) cladding said second planar surface of said first solder body with a third solder body having a fifth and sixth planar surface such that said second barrier is disposed between said second and fifth planar surfaces;
   e) positioning said third solder body over an electrical contact pad having a seventh planar surface such that said sixth planar surface is parallel to said seventh planar surface;

f) heating said third solder body to a temperature that is above the melting temperature of said third solder body but below the melting temperature of said first solder body such that said third solder body is wetted onto said electrical contact pad.

27. The method according to claim 26 wherein said first, second, and third solder bodies comprise solder cylinders.

28. The method according to claim 26 wherein said first, second, and third solder bodies comprise rectangular solder members.

29. The method according to claim 26 wherein said first and third solder bodies comprise 60/40 Sn/Pb.

30. The method according to claim 26 wherein said second solder body comprises 90/10 Pb/Sn.

31. The method according to claim 26 wherein said first and second barrier layers comprise nickel.

32. The method according to claim 26 wherein said first and second barriers comprise palladium.

33. A method of forming a solder bump on a package, said method comprising the steps of:

a) positioning a solid solder member having at least one planar surface over an electrical contact pad having a second planar surface wherein said at least one planar surface is substantially parallel to said second planar surface;

b) heating said solid solder member to a temperature that is above the melting temperature of said solid solder member such that said solid solder member becomes substantially rounded and is wetted onto said electrical contact pad.

34. The method according to claim 33 wherein said solid solder member comprises a solder cylinder.

35. The method according to claim 33 wherein said solid solder member comprises a rectangular solder member.

36. The method according to claim 33 wherein said solid solder member comprises 60/40 Sn/Pb.

37. The method according to claim 36 wherein said heating step is performed at a temperature in the range of approximately 225° C. plus or minus 20° C.

* * * * *

UNITED STATES PATENT AND TRADEMARK OFFICE
CERTIFICATE OF CORRECTION

PATENT NO.    : 5,542,174
DATED         : August 6, 1996
INVENTOR(S)   : George W. Chiu It is certified that error appears in the above-identified patent and that said Letters Patent is hereby corrected as shown below:

In column 1 at line 23 delete "army" and insert --array--

Signed and Sealed this

Twenty-second Day of April, 1997

Attest:

BRUCE LEHMAN

*Commissioner of Patents and Trademarks*

*Attesting Officer*